(12) United States Patent
Noh

(10) Patent No.: US 12,349,291 B2
(45) Date of Patent: Jul. 1, 2025

(54) FAULT DIAGNOSTIC APPARATUS USING MICROPHONE

(71) Applicant: Jin Moon Noh, Gyeonggi-do (KR)

(72) Inventor: Jin Moon Noh, Gyeonggi-do (KR)

( * ) Notice: Subject to any disclaimer, the term of this patent is extended or adjusted under 35 U.S.C. 154(b) by 245 days.

(21) Appl. No.: 18/207,224

(22) Filed: Jun. 8, 2023

(65) Prior Publication Data

US 2024/0381545 A1  Nov. 14, 2024

(30) Foreign Application Priority Data

May 12, 2023 (KR) .......................... 10-2023-0061483

(51) Int. Cl.
*H05K 5/00* (2025.01)
*G01D 11/24* (2006.01)
*G01H 1/00* (2006.01)
*H04R 1/04* (2006.01)
*H05K 5/02* (2006.01)
*G01M 13/00* (2019.01)

(52) U.S. Cl.
CPC .......... *H05K 5/006* (2013.01); *G01D 11/245* (2013.01); *H04R 1/04* (2013.01); *H05K 5/0247* (2013.01); *G01H 1/00* (2013.01); *G01M 13/00* (2013.01)

(58) Field of Classification Search
CPC ........ H05K 5/006; G01D 11/245; H04R 1/04; G01H 1/00
USPC ......................................... 381/111, 122, 150
See application file for complete search history.

(56) References Cited

U.S. PATENT DOCUMENTS

2006/0164230 A1 * 7/2006 DeWind ................. B60K 35/00
340/461

FOREIGN PATENT DOCUMENTS

KR  10-1491017 B1  2/2015

* cited by examiner

*Primary Examiner* — Thjuan K Addy
(74) *Attorney, Agent, or Firm* — The PL Law Group, PLLC

(57) ABSTRACT

A fault diagnostic apparatus may include an upper case with a bottom having an opening, a lower case coupled to the bottom of the upper case, and a printed circuit board (PCB) substrate module including a substrate supported on an inner side of the upper case or the lower case, and a microphone disposed in the substrate adjacent to the vibration plate to generate a sensing signal of an acoustic wave by the vibration generated from the vibration plate. The lower case may have a vibration plate formed toward the upper case on a lower surface and be configured to vibrate itself in response to an external vibration.

5 Claims, 7 Drawing Sheets

FAULT DIAGNOSTIC APPARATUS USING MICROPHONE

CROSS-REFERENCE TO RELATED APPLICATION AND CLAIM OF PRIORITY

This application claims the benefit under 35 USC § 119 of Korean Patent Application No. 10-2023-0061483, filed on May 12, 2023, in the Korean Intellectual Property Office, the entire disclosure of which is incorporated herein by reference for all purposes

BACKGROUND

1. Field

The present disclosure relates to a fault diagnostic apparatus using a microphone.

2. Description of the Related Art

In general, high-priced vibration sensors or workers' five senses are used to detect faults in machineries used in industrial sites.

However, in the case of the inside of machineries, since it is difficult for humans to access due to inadequate operating environment, the price of diagnostic apparatus increases and it is more difficult to measure.

Many attempts have been made to diagnose faults using sound, but microphones having the principle of converting vibration of air into an electrical signal fail to accurately measure under the influence of ambient noise, and thus their use has been avoided.

SUMMARY

The present disclosure is designed in the above-described background, and therefore the present disclosure is directed to providing a fault diagnostic apparatus using a microphone that reduces on-site industrial repair and maintenance and industrial safety cost burden through the fault diagnostic apparatus that cancels ambient noise, keeps out water or contaminants, ensures water, dust and explosion proof safety to prevent explosion by reaction with dust or chemicals and has a relatively low price.

The present disclosure is further directed to providing a fault diagnostic apparatus using a microphone that achieves less expensive and more accurate fault diagnosis in not only industrial sites but also vehicles, ships or the like.

The present disclosure is further directed to providing a fault diagnostic apparatus using a microphone that achieves fault diagnosis by detecting vibration of air in the apparatus when the vibration is transmitted to a vibration plate even in an air deficient environment such as underwater or space environment.

The objective of the present disclosure is not limited thereto, and these and other objectives will be clearly understood by those skilled in the art from the following description.

To achieve the above-described objective, an embodiment of the present disclosure provides a fault diagnostic apparatus using a microphone, including an upper case with open bottom, a lower case coupled to the bottom of the upper case, and having a vibration plate which is formed toward the upper case on a lower surface and vibrates itself in response to external vibration, and a printed circuit board (PCB) substrate module including a substrate which is securely supported on an inner side of the upper case or the lower case, and a microphone which is disposed in the substrate adjacent to the vibration plate to generate a sensing signal of an acoustic wave by the vibration generated from the vibration plate.

Additionally, there is provided the fault diagnostic apparatus using the microphone, further including a cable gland coupled to a top of the upper case, to securely support a cable which electrically connects an external computing device to the PCB substrate module to transmit the sensing signal to the external computing device.

Additionally, there is provided the fault diagnostic apparatus using the microphone, wherein the lower case is coupled by inserting a side through the open bottom of the upper case.

Additionally, there is provided the fault diagnostic apparatus using the microphone, wherein the upper case includes an upper case guide that protrudes an inward direction on a lateral inner circumferential surface, the lower case includes a lower case guide that protrudes in the inward direction corresponding to a location of the upper case guide on a lateral inner circumferential surface, and a fastening member passing through the lower case guide and the substrate is coupled to the upper case guide.

Additionally, there is provided the fault diagnostic apparatus using the microphone, wherein the vibration plate is formed in a shape of a cone or dome that protrudes convexly toward the upper case.

According to an embodiment of the present disclosure, it is possible to reduce on-site industrial repair and maintenance and industrial safety cost burden through the fault diagnostic apparatus that cancels ambient noise, keeps out water or contaminants, ensures water, dust and explosion proof safety to prevent explosion by reaction with dust or chemicals and has a relatively low price.

Additionally, it is possible to achieve less expensive and more accurate fault diagnosis in not only industrial sites but also vehicles, ships or the like.

Additionally, it is possible to achieve fault diagnosis by detecting vibration of air in the apparatus when the vibration is transmitted to the vibration plate even in an air deficient environment such as underwater or space environment.

DETAILED DESCRIPTION

Hereinafter, some embodiments of the present disclosure will be described in detail through the accompanying drawings. In affixing the reference signs to the elements of each drawing, it should be noted that the identical elements have the identical signs as possible although they are shown in different drawings. Additionally, in describing the present disclosure, when it is determined that a detailed description of relevant known feature or function may obscure the subject matter of the present disclosure, its detailed description is omitted.

Additionally, in describing the elements of the present disclosure, the terms "first", "second", A, B, (a), (b) or the like may be used. These terms are used to distinguish one element from another, and the nature, sequence or order of the corresponding elements are not limited by the terms. When an element is referred to as being "connected to", "coupled to" or "joined to" another element, the element may be directly connected or joined to the other element, but it should be understood that intervening elements may be "connected", "coupled" or "joined" between each element.

Figure 1:
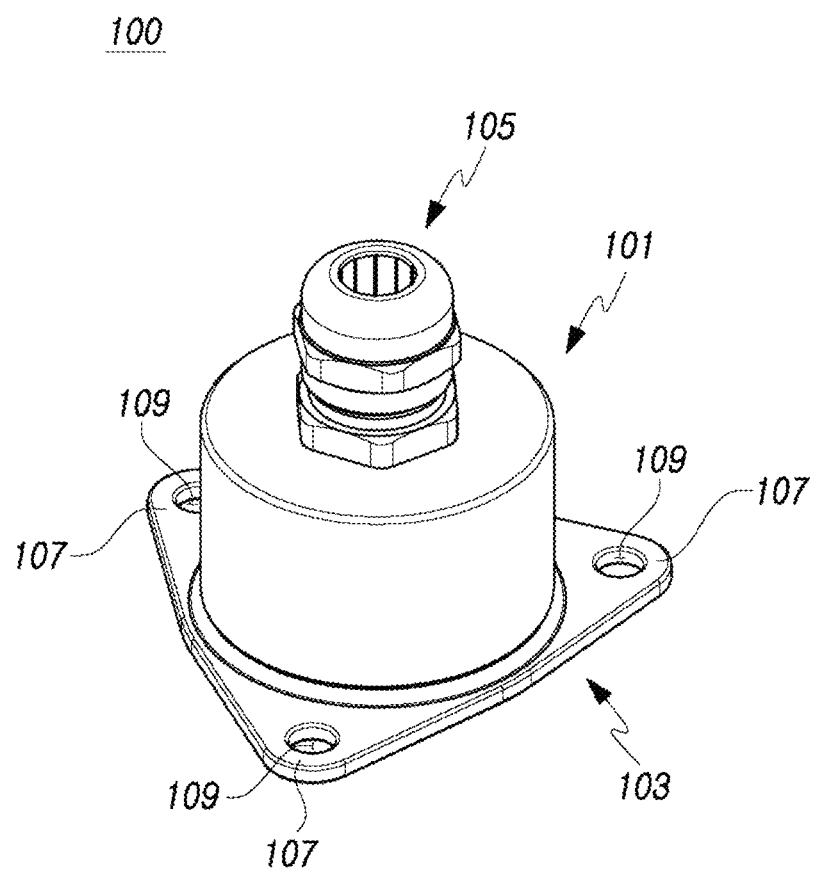
FIG. 1 is a perspective view of a fault diagnostic apparatus using a microphone according to an embodiment of the present disclosure.
Figure 2:
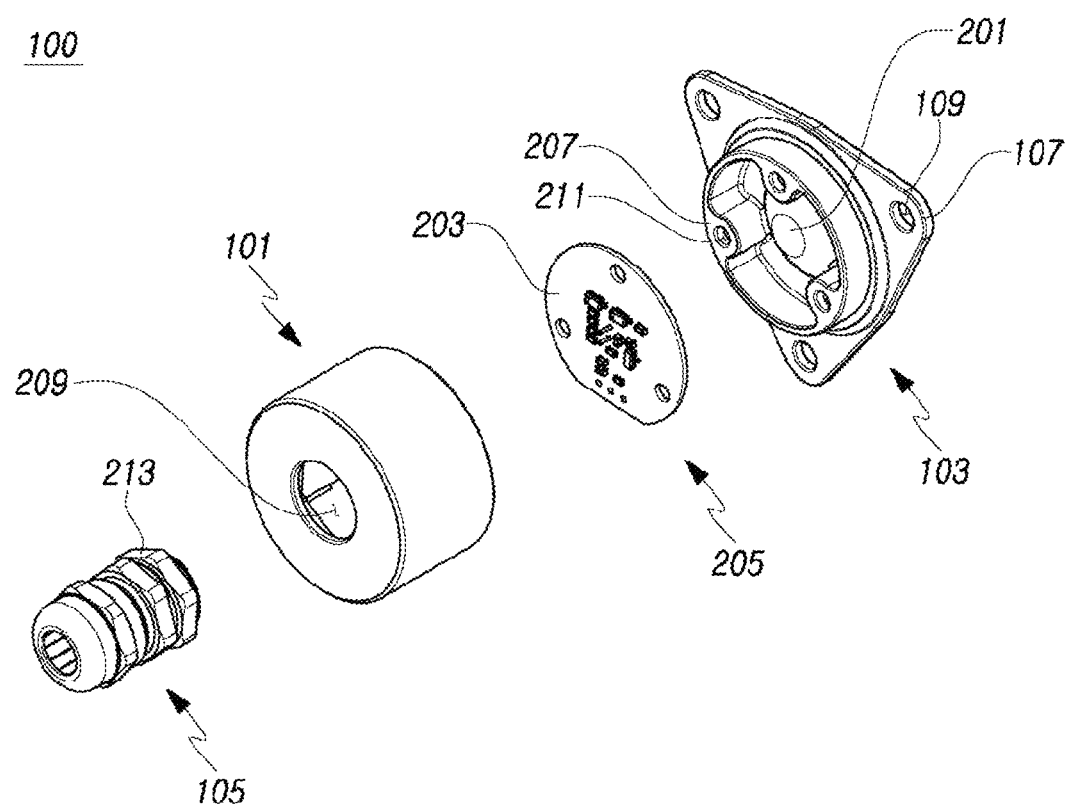
FIGS. 2 and 3 are exploded perspective views of the fault diagnostic apparatus using the microphone shown in FIG. 1.
Figure 3:
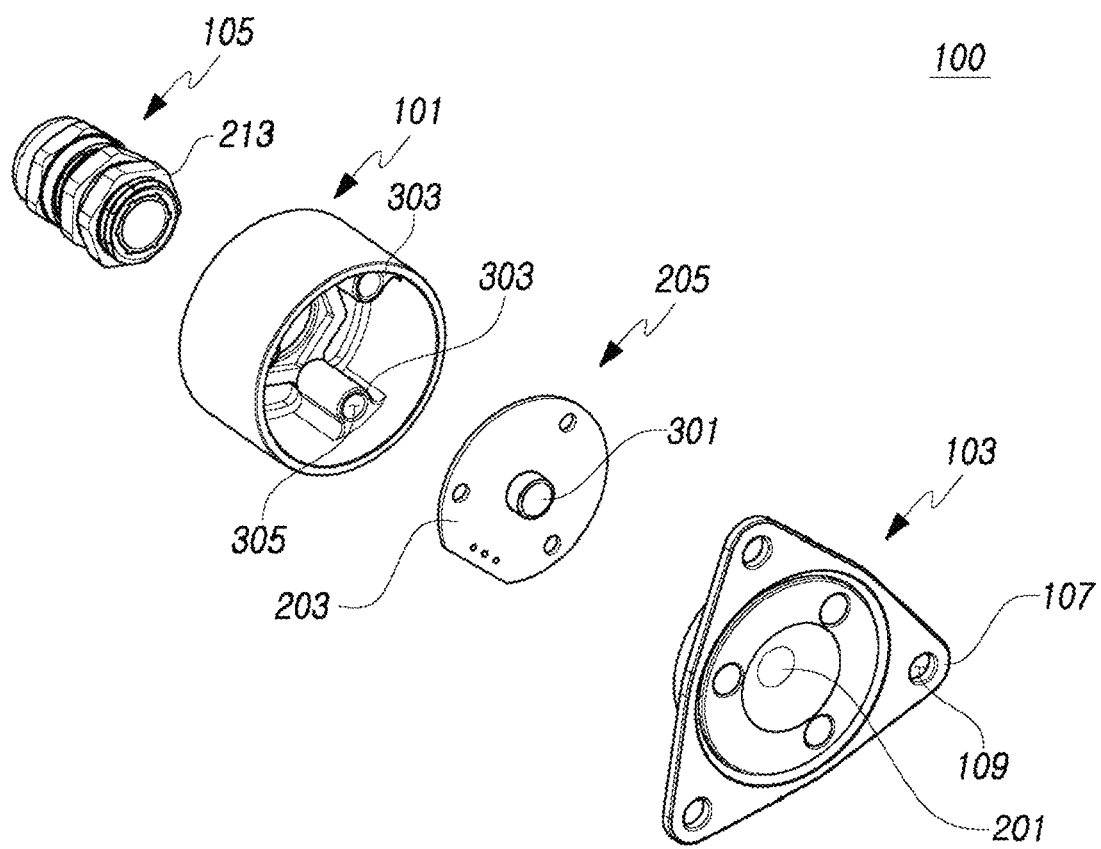
Figure 4:
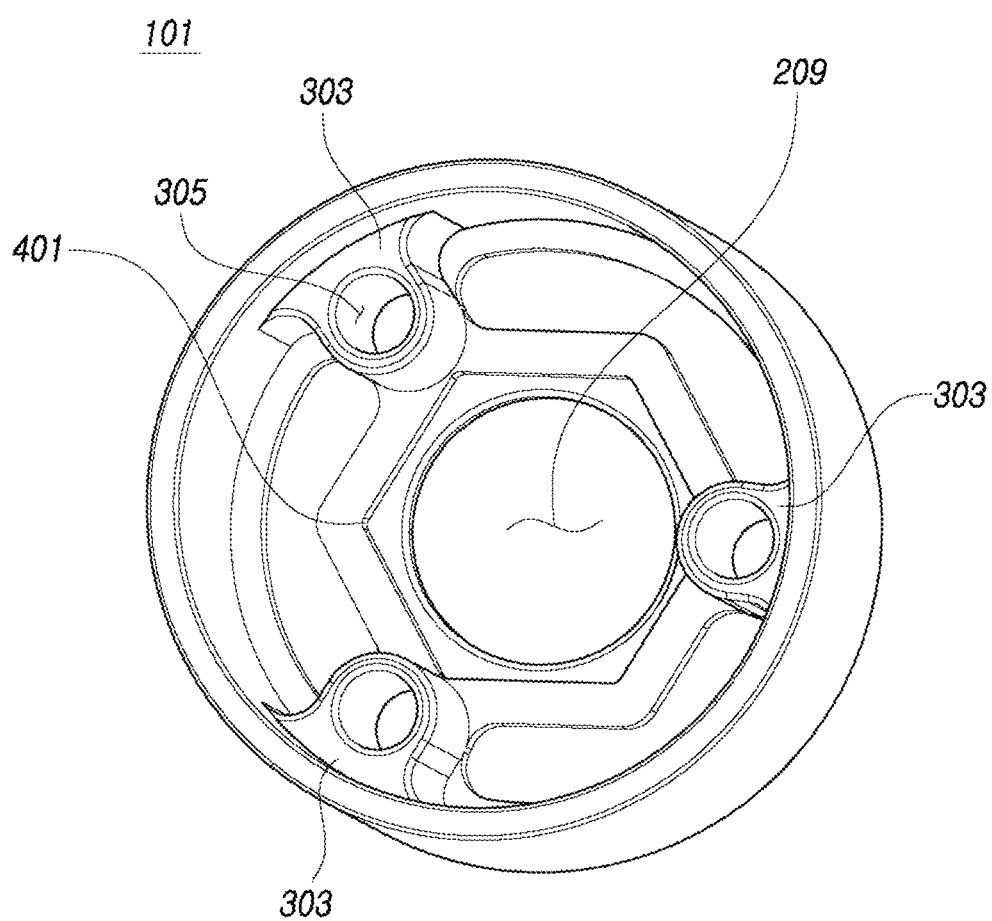
FIG. 4 is a perspective view showing the internal structure of a lower case.
Figure 5:
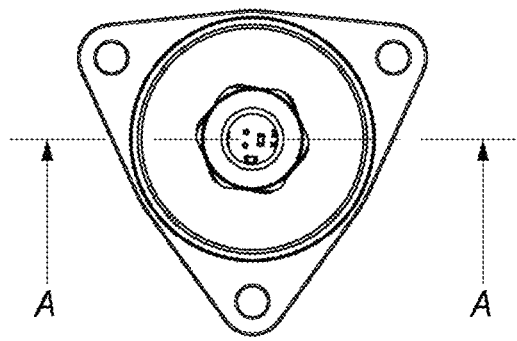
FIG. 5 is a cross-sectional view of the fault diagnostic apparatus using the microphone shown in FIG. 1, taken along the line A-A.
Figure 5:
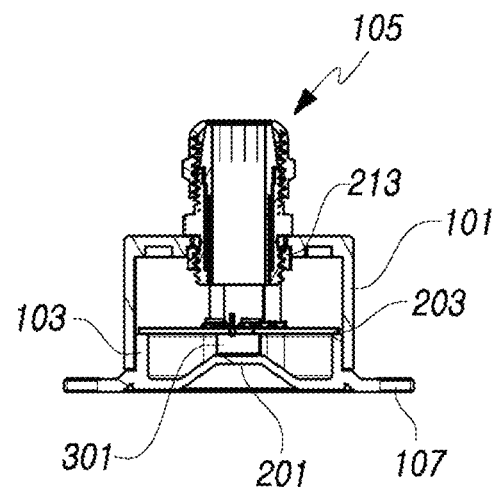
Figure 6:
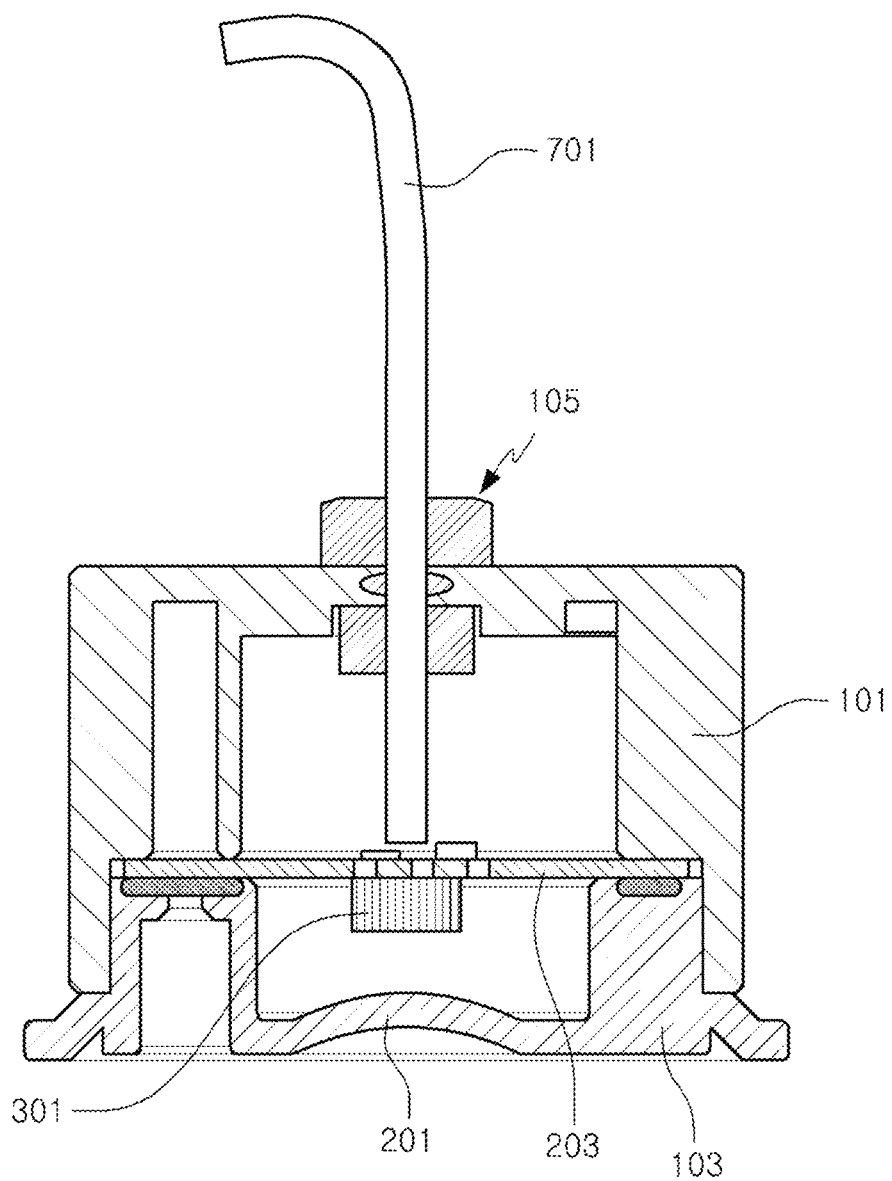
FIG. 6 is a diagram showing a cable connected to a PCB substrate module through a cable gland.
Figure 7:
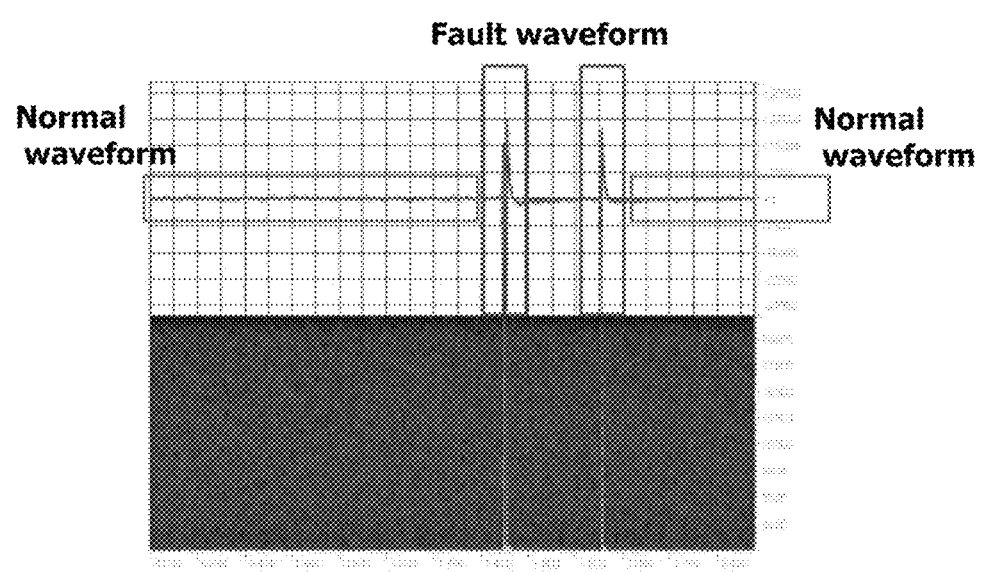
FIG. 7 is a diagram showing a fault waveform and a normal waveform measured by a fault diagnostic apparatus using a microphone according to an embodiment of the present disclosure.

FIG. 1 is a perspective view of a fault diagnostic apparatus using a microphone according to an embodiment of the present disclosure. FIGS. 2 and 3 are exploded perspective views of the fault diagnostic apparatus using the microphone shown in FIG. 1. FIG. 4 is a perspective view showing the internal structure of a lower case. FIG. 5 is a cross-sectional view of the fault diagnostic apparatus using the microphone shown in FIG. 1, taken along the line A-A. FIG. 6 is a diagram showing a cable connected to a printed circuit board (PCB) substrate module through a cable gland. FIG. 7 is a diagram showing a fault waveform and a normal waveform measured by the fault diagnostic apparatus using the microphone according to an embodiment of the present disclosure.

As shown in these drawings, the fault diagnostic apparatus 100 using the microphone according to an embodiment of the present disclosure includes an upper case 101 with open bottom; a lower case 103 coupled to the bottom of the upper case 101, and having a vibration plate 201 that is formed toward the upper case 101 on the lower surface and vibrates itself in response to external vibration; and the PCB substrate module 205 including a substrate 203 that is securely supported on the inner side of the upper case 101 or the lower case 103, and the microphone 301 disposed in the substrate 203 adjacent to the vibration plate 201 to generate a sensing signal of an acoustic wave by vibration generated from the vibration plate 201.

Hereinafter, each component will be described in detail.

The upper case 101 has an open bottom.

For example, the upper case 101 may have a shape a cylinder with open bottom, and may be made in various shapes, for example, prismatic, conic and prismoidal shapes, depending on the installation environment.

The upper case 101 may include an upper case guide 303 that protrudes in the inward direction on the lateral inner circumferential surface.

For example, three upper case guides 303 may be formed at equal intervals along the lateral inner circumferential surface of the upper case 101, but the number of the upper case guides 303 is not limited thereto and may variously change.

The upper case guide 303 has a fastening groove 305 extended in the lengthwise direction.

A fastening member (not shown) passing through a lower case guide 207 as described below and the substrate 203 is coupled to the fastening groove 305 of the upper case guide 303.

Meanwhile, a coupling hole 209 may be formed in the upper surface of the upper case 101 to couple a cable gland 105 as described below.

A seating step 401 is formed around the coupling hole 209 on the lower surface of the top of the upper case 101, and supports the outer circumferential surface of a nut 213 that fixes the cable gland 105 when the nut 213 is seated.

Subsequently, the lower case 103 is coupled to the bottom of the upper case 101.

The lower case 103 may be coupled by inserting the side through the open bottom of the upper case 101.

The vibration plate 201 that vibrates itself in response to external vibration is formed toward the upper case 101 on the lower surface of the lower case 103.

For example, the vibration plate 201 may be formed in the shape of a cone or a dome that protrudes convexly toward the upper case 101.

Since the vibration plate 201 is close to the microphone 301 and converts mechanical vibration to vibration of air and transmits it to the microphone 301, the vibration plate 201 may be formed in the shape of a thin cone or dome to receive the mechanical vibration and effectively transmit it to the microphone 301.

For example, in the case of non-metal material, the vibration plate 201 is preferably formed with a thickness of 1.2 mm or less, and in the case of metal, 0.6 mm or less, but may be made of any material that can transmit vibration well while withstanding vibration and ensures explosion resistance performance, and may be as thin as possible within the limit of resistance to tearing or breaking while transmitting vibration well depending on the material used.

The flat upper surface of the vibration plate 201 is assembled close to the bottom of the microphone 301 (0.5 mm or less).

Meanwhile, since the vibration amplitude of the apparatus in faulty condition is small, in case where the vibration plate 201 cannot properly transmit vibration by the material of the upper and lower cases 101, 103, the vibration plate 201 may be formed in the shape of a thin silicone film (center thickness 0.5 mm or less), and tightly adhered to the lower case 103 using an adhesive, for example, an epoxy, to maximize the vibration transmission.

In this instance, the lower case 103 is preferably designed with a large thickness to prevent the infiltration of external noise (a dual barrier structure is possible).

The lower case 103 may include the lower case guide 207 that protrudes in the inward direction corresponding to the location of the upper case guide 303 on the lateral inner circumferential surface.

For example, three lower case guides 207 may be formed at equal intervals along the lateral inner circumferential surface of the lower case 103, but the number of the lower case guides 207 is not limited thereto and may variously change depending on the number of the upper case guides 303.

The lower case guide 207 has a fastening hole 211 extended in the lengthwise direction.

The fastening member (not shown) passing through the fastening hole 211 may be coupled to the fastening groove 305 of the upper case guide 303 through the substrate 203 as described below, so the lower case 103, the substrate 203 and the upper case 101 may be securely coupled to one another.

The lower case 103 is preferably coupled in close contact with the upper case 101 to form a hermetic structure.

In case where the fault diagnostic apparatus 100 using the microphone according to an embodiment of the present disclosure is manufactured as a product that is wasted due to no chance to repair the product when the product is faulty, the lower case 103 and the upper case 101 may be completely sealed by welding or bonding.

Meanwhile, the lower case 103 may include a fixing wing 107 extended from the bottom of the side in the outward direction.

The fixing wing 107 may have a fixing member coupling hole 109, and a fixing member such as a bolt may secure the lower case 103 to the installation surface through the fixing member coupling hole 109.

Subsequently, the PCB substrate module 205 includes the substrate 203 and the microphone 301.

The substrate 203 is securely supported on the inner side of the upper case 101 or the lower case 103.

As described above, the substrate 203 may be securely supported by the fastening member (not shown) that is coupled to the fastening groove 305 of the upper case guide 303 through the fastening hole 211 of the lower case guide 207.

The microphone 301 is disposed in the substrate 203 adjacent to the vibration plate 201.

The microphone 301 generates a sensing signal of a sound wave by the vibration generated from the vibration plate 201.

The microphone 301 may be provided as, for example, a condenser microphone.

Meanwhile, the fault diagnostic apparatus 100 using the microphone according to an embodiment of the present disclosure may further include the cable gland 105 coupled to the top of the upper case 101 to securely support a cable 701 that electrically connects an external computing device (not shown) to the PCB substrate module 205 to transmit the sensing signal generated by the microphone 301 to the external computing device.

Here, when the cable gland 105 cannot be mounted due to the limitations of the surrounding environment in which the fault diagnostic apparatus 100 using the microphone according to an embodiment of the present disclosure is installed, the cable 701 may be directly inserted through the coupling hole 209 of the upper case 101 and connected to the PCB substrate module 205.

In this instance, the cable 701 and the coupling hole 209 may be sealed by sealing or packing.

The cable 701 may be provided as an explosion-proof cable.

FIG. 7 shows an example of a fault waveform and a normal waveform measured by the fault diagnostic apparatus 100 using the microphone according to an embodiment of the present disclosure.

It was confirmed through the experiment that a vibration signal of the machine was successively transmitted to a microphone input terminal of the connected external computing device after cancelling ambient noise and converting only vibration to sound without any amplifier between them by connecting the cable 701 of 50 m in length.

As described above, according to an embodiment of the present disclosure, it is possible to reduce on-site industrial repair and maintenance and industrial safety cost burden through the fault diagnostic apparatus that cancels ambient noise, keeps out water or contaminants, ensures water, dust and explosion proof safety to prevent explosion by reaction with dust or chemicals and has a relatively low price.

Additionally, it is possible to achieve less expensive and more accurate fault diagnosis in not only industrial sites but also vehicles, ships or the like.

Additionally, it is possible to achieve fault diagnosis by detecting vibration of air in the apparatus when the vibration is transmitted to the vibration plate even in an air deficient environment such as underwater or space environment.

Although it has been hereinabove described that all the elements according to an embodiment of the present disclosure are combined into one or work in combination, the present disclosure is not necessarily limited to this embodiment. That is, all the elements may be selectively combined into at least one and work in combination within the intended scope of the present disclosure.

Although the foregoing description describes the technical spirit of the present disclosure by way of illustration, it is obvious to those having ordinary skill in the technical field pertaining to the present disclosure that a variety of modifications and changes may be made thereto without departing from the essential features of the present disclosure. Accordingly, the disclosed embodiments are provided to describe the technical spirit of the present disclosure, but not intended as limiting, and the scope of technical spirit of the present disclosure is not limited by these embodiments. The scope of protection of the present disclosure should be interpreted by the appended claims, and it should be construed that all the technical spirit within the equivalent scope falls within the scope of protection of the present disclosure.

What is claimed is:

1. A fault diagnostic apparatus comprising:
   an upper case with a bottom having an opening;
   a lower case coupled to the bottom of the upper case, the lower case having a vibration plate formed toward the upper case on a lower surface and configured to vibrate itself in response to an external vibration; and
   a printed circuit board (PCB) substrate module including a substrate supported on an inner side of the upper case or the lower case, and a microphone disposed in the substrate adjacent to the vibration plate to generate a sensing signal of an acoustic wave by the vibration generated from the vibration plate.

2. The fault diagnostic apparatus according to claim 1, further comprising:
   a cable gland coupled to a top of the upper case, to securely support a cable which electrically connects an external computing device to the PCB substrate module to transmit the sensing signal to the external computing device.

3. The fault diagnostic apparatus according to claim 1, wherein the lower case is coupled by inserting a side through the opening of the bottom of the upper case.

4. The fault diagnostic apparatus according to claim 3, wherein the upper case includes an upper case guide that protrudes an inward direction on a lateral inner circumferential surface,
   wherein the lower case includes a lower case guide that protrudes in the inward direction corresponding to a location of the upper case guide on a lateral inner circumferential surface, and
   wherein a fastening member passing through the lower case guide and the substrate is coupled to the upper case guide.

5. The fault diagnostic apparatus according to claim 1, wherein the vibration plate is formed in a shape of a cone or dome that protrudes convexly toward the upper case.

* * * * *